(12) United States Patent
Allen et al.

(10) Patent No.: US 7,288,362 B2
(45) Date of Patent: Oct. 30, 2007

(54) IMMERSION TOPCOAT MATERIALS WITH IMPROVED PERFORMANCE

(75) Inventors: Robert David Allen, San Jose, CA (US); Phillip Joe Brock, Sunnyvale, CA (US); Dario Gil, Pleasantville, NY (US); William Dinan Hinsberg, Fremont, CA (US); Carl Eric Larson, San Jose, CA (US); Linda Karin Sundberg, Los Gatos, CA (US); Gregory Michael Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 11/063,940

(22) Filed: Feb. 23, 2005

(65) Prior Publication Data

US 2006/0188804 A1     Aug. 24, 2006

(51) Int. Cl.
G03C 1/73      (2006.01)
G03C 1/825     (2006.01)
G03F 7/20      (2006.01)
G03F 7/30      (2006.01)
G03F 7/36      (2006.01)

(52) U.S. Cl. .................. 430/270.1; 430/907; 430/910; 430/325; 430/326; 430/313; 430/323; 526/242; 526/245

(58) Field of Classification Search ................ None
See application file for complete search history.

(56) References Cited

U.S. PATENT DOCUMENTS

| | | | |
|---|---|---|---|
| 5,240,812 A | 8/1993 | Conley et al. | 430/273.1 |
| 5,939,237 A | 8/1999 | Gardner, Jr. et al. | 430/273.1 |
| 6,274,295 B1 * | 8/2001 | Dammel et al. | 430/322 |
| 6,790,580 B2 | 9/2004 | Takechi | 430/176 |
| 6,861,199 B2 * | 3/2005 | Lee | 430/270.1 |
| 2003/0232276 A1 | 12/2003 | Poss et al. | 430/270.1 |
| 2004/0091813 A1 | 5/2004 | Poss et al. | 430/270.1 |
| 2004/0248034 A1 * | 12/2004 | Henderson et al. | 430/270.1 |
| 2005/0202351 A1 * | 9/2005 | Houlihan et al. | 430/322 |
| 2005/0250898 A1 * | 11/2005 | Maeda et al. | 524/544 |

FOREIGN PATENT DOCUMENTS

| JP | 2003345026 | 12/2003 |
|---|---|---|
| JP | 2004037887 A | 1/2004 |

OTHER PUBLICATIONS

Bruce, et al., "Photoreactive Topcoat to Reduce Thin Film Interference in Photo-Resist", IBM Technical Disclosure Bulletin, vol. 34, No. 3, Aug. 1991, pp. 130-131, with Abstract.

"Topcoat Formulation for Oxygen Sensitive Resists", IBM Technical Disclosure Bulletin, https://www.delphion.com/tdbs/tdb?0=70C%2000353, last update Nov. 28, 2004.

"Technology backgrounder: Immersion Lithography" ICKnowledge.com, 2003 IC Knowledge, pp. 1-5.

Mariner, et al., "Review of bubble printability in immersion lithography", Phillips Research Leuven, Kapeldreef 75, B3001 Leuven, Belgium, Abstract, Aug. 2004.

Gil, et al., "Thoughts on "active" Particle Control in Immersion Lithography", pp. 1-2.

* cited by examiner

*Primary Examiner*—Sin Lee
(74) *Attorney, Agent, or Firm*—Scully, Scott, Murphy & Presser, P.C.; Todd M. C. Li, Esq.

(57) ABSTRACT

A topcoat material for applying on top of a photoresist material is disclosed. The topcoat material comprises at least one solvent and a polymer which has a dissolution rate of at least 3000 Å/second in aqueous alkaline developer. The polymer contains a hexafluoroalcohol monomer unit comprising one of the following two structures:

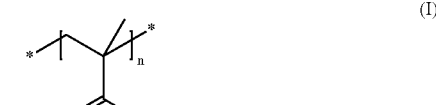

(I)

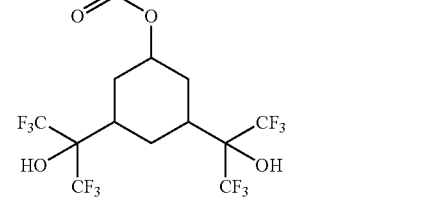

(II)

wherein n is an integer. The topcoat material may be used in lithography processes, wherein the topcoat material is applied on a photoresist layer. The topcoat material is preferably insoluble in water, and is therefore particularly useful in immersion lithography techniques using water as the imaging medium.

25 Claims, 3 Drawing Sheets

IMMERSION TOPCOAT MATERIALS WITH IMPROVED PERFORMANCE

FIELD OF THE INVENTION

This invention relates to a topcoat material and the use thereof in lithography processes. More particularly, this invention is directed to a topcoat material comprising at least one solvent and a polymer having a dissolution rate of at least 3000 Å/sec in an aqueous alkaline developer. The inventive topcoat material is especially useful for immersion lithography in which a liquid such as water is used as the exposure medium between the lens fixture of an exposure tool and the photoresist-coated wafer.

BACKGROUND OF THE INVENTION

Traditionally, topcoat materials have been used in photolithography as anti-reflective films on the top of a photoresist. The top anti-reflective coat (TARC) materials can prevent the multiple interference of light that takes place within the photoresist layer during exposure. As a result, the critical dimension (CD) variation of the geometrical features of a photoresist pattern caused by the variation in the thickness of the photoresist film can be minimized.

To fully take advantage of the anti-reflective effect of the topcoat, the refractive index of the topcoat material ($n_t$) should be at about the square root of the product of the refractive index of the exposure medium ($n_m$) and the refractive index of the underlying photoresist ($n_r$). If the exposure medium is air, as in the case for "dry" lithography, the optimal refractive index of the topcoat material ($n_t$) should be at about the square root of the refractive index of the underlying photoresist ($n_r$) since the refractive index of air is roughly 1.

For ease of processing, classic TARC materials are designed to be soluble in both water and aqueous base developers so that they can be applied directly from water solution and subsequently removed by the aqueous base developer during the develop stage.

Numerous topcoat materials have been developed to meet these two requirements of optimal refractive index and solubility. For example, U.S. Pat. Nos. 5,744,537 and 6,057,080 disclose aqueous-soluble TARC materials comprising a polymeric binder and a fluorocarbon compound which have nearly ideal refractive indices on the order of 1.3-1.4. U.S. Pat. No. 5,879,853 also discloses a TARC material that is removable by a wet process. U.S. Pat. No. 5,595,861 similarly discloses a TARC comprising partially fluorinated compounds which can also be water soluble. U.S. Pat. No. 6,274,295 discloses a TARC material comprising a light absorbing compound having a wavelength of maximum absorption higher than an exposure wavelength used to expose the photoresist. This TARC can also be water-soluble. Finally, U.S. Pat. No. 5,240,812 discloses a protective material for use as an overcoat film for acid catalyzed resist compositions to prevent contamination from vapors of organic and inorganic bases. While not specifically disclosed as being a TARC, the overcoat can also be water soluble.

Immersion lithography offers the potential to extend the use of optical lithography to print smaller features. In immersion lithography, air is replaced by a liquid medium such as water between the lens and the wafer. Use of a medium with an index of refraction higher than air results in a greater numerical aperture (NA), and therefore allows printing of smaller features. See "Technology Backgrounder: Immersion Lithography," published by ICKnowledge.com at http://www.icknowledge.com, May 28, 2003. See also L. Geppert, "Chip Making's Wet New World," IEEE Spectrum, Vol. 41, Issue 5, May 2004, pp. 29-33.

One of the technical challenges facing liquid immersion lithography is the diffusion between the photoresist components and the immersion medium. That is, during the immersion lithographic process, the photoresist components leach into the immersion medium and the immersion medium permeates into the photoresist film. Such diffusion is detrimental to photoresist performance and might result in disastrous lens damage or contamination in a 40 million dollar lithography tool. Topcoat materials can be applied on top of the photoresist layer for the purpose of eliminating diffusion of materials from the photoresist layer underneath. Preferably, the topcoat material can also act as a TARC layer.

Since water has been proposed as the exposure medium for 193 nm immersion lithography, classic water-soluble TARC materials such as those described above cannot be used as topcoats for such technology. Other commercial materials currently available either require solvents that are incompatible with semiconductor fab lines or impact the lithographic performance of the photoresist. New topcoat materials are needed to ensure the deployment of 193 nm immersion lithography necessary for manufacture of semiconductor devices at 65 nm and below design ground rules.

A serious technical challenge facing immersion lithography is the presence of bubbles and/or other small particles at the photoresist surface. The presence of small bubbles and/or particles at the photoresist surface causes printable image defects. One way to prevent this effect is through the application of a topcoat of sufficient thickness such that the bubbles and/or small particles are out of the focal plane of the lens and thus they are no longer lithographically printable. This thick coating can be described as an in situ pellicle. For purposes of this application, such a coating will be referred to simply as a pellicle. In addition, the thick topcoat material may reduce extraction of resist components into the immersion medium as compared to prior art thin topcoat materials. Since prior art immersion topcoat materials have a lower dissolution rate in developer than the underlying exposed photoresist, such topcoat films are necessarily very thin, so they can be quickly stripped with developer during the photoresist develop step. If the topcoat film is not removed quickly, the photoresist performance will be negatively impacted. Therefore, a topcoat film that is thick enough to move the surface bubbles and/or particles out of the lithography process focal plane would not be acceptable for use in immersion lithography unless the thick topcoat film could still be rapidly stripped under normal development conditions.

Thus, there remains a need for a topcoat material that is highly soluble in developer, resistant to immersion fluid, compatible with photoresist, and has desired optical properties so that it can also be used as a TARC.

SUMMARY OF THE INVENTION

Accordingly, the present invention is directed to a topcoat material for application on top of a photoresist material. The topcoat material comprises at least one solvent and a polymer which has a dissolution rate of at least 3000 Å/second in an aqueous alkaline developer. The polymer of the present invention contains a hexafluoroalcohol monomer unit comprising one of the following two structures:

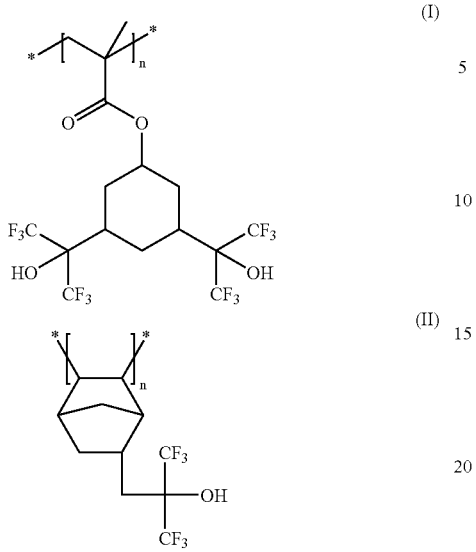

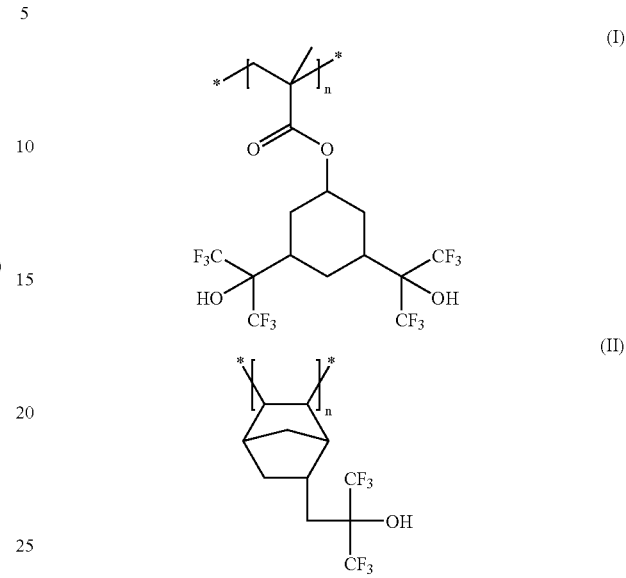

wherein n is an integer; and
at least one solvent.

The above-shown monomer unit (I) is a bis-hexafluoroalcohol monomer and monomer unit (II) is a mono-hexafluoroalcohol monomer.

The present invention is also directed to a topcoat material comprising a copolymer which comprises a monomer of cyclohexanol methacrylate distributed with hexafluoroalcohol groups (BiscyclohexylHFAMA) and one or more co-monomers comprising up to 50 mole % of the copolymer. When said copolymer comprises a monomer of BiscyclohexylHFAMA and more than one co-monomers, said more than one co-monomers can be the same or different. Said one or more co-monomers include, but are not limited to methacrylates and/or acrylates. The preferred methacrylate co-monomers include methyl methacrylate, ethyl methacrylate, alicyclic methacrylate, or acyclic alkyl substituted methacrylates wherein the alkyl and the alicyclic can independently have 1 to 12 carbon atoms. In addition, other methacrylate monomers such as methacrylic acid, hydroxyethyl methacrylate, hydroxypropyl methacrylate, or hydroxy substituted alicyclic methacrylate, or acyclic hydroxyalkyl substituted methacrylates wherein the alkyl and the alicyclic independently have 1 to 12 carbon atoms, may be incorporated to improve the mechanical performance or adhesion of the topcoat polymer to the photoresist polymer underneath. The preferred acrylate co-monomers include methyl acrylate, ethyl acrylate, alicyclic acrylate, acyclic alkyl substituted acrylates, acrylic acid, hydroxyethyl acrylate, hydroxypropyl acrylate, hydroxy substituted alicyclic acrylate, and acyclic hydroxyalkyl substituted acrylates, wherein the alkyl and the alicyclic independently have 1 to 12 carbon atoms. It is understood to one skilled in the art that suitable co-monomers also include any analogous methacrylates or acrylates of the above-mentioned methacrylate and acrylate co-monomers. The structure of a copolymer comprising a monomer unit (I) and one co-monomer is illustrated below. It is understood to one skilled in the art that the aforementioned copolymer may comprise a monomer unit (I) and wherein n is an integer.

In another aspect, the present invention is directed to a method of forming a patterned material layer on a substrate, the method comprising: providing a substrate having a material layer on a surface thereof; depositing a photoresist composition on the substrate to form a photoresist layer on the material; applying the above-mentioned topcoat material on the photoresist layer, thereby forming a coated substrate; pattern-wise exposing the coated substrate to an imaging radiation; contacting the coated substrate with an aqueous alkaline developer, wherein the topcoat material and a portion of the photoresist layer are simultaneously removed from the coated substrate, thereby forming a patterned photoresist layer on the material layer; and transferring the pattern in the photoresist layer to the material layer.

DETAILED DESCRIPTION OF THE INVENTION

Figure 1:
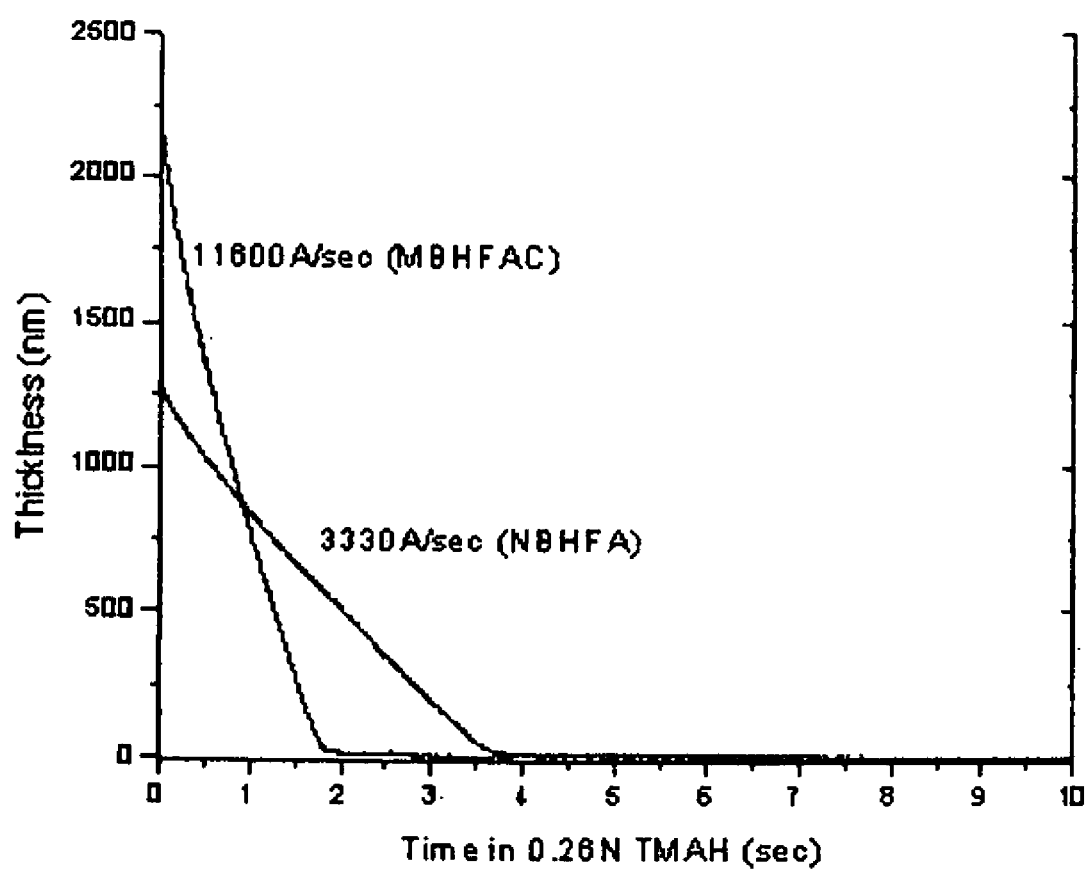
FIG. 1 is a graph plotting thickness (nm) v. time (sec) illustrating the dissolution rates for the inventive topcoat materials containing MBHFAC and NBHFA.

The present invention is directed to a topcoat material comprising at least one solvent and a polymer which has a dissolution rate of at least 3000 Å/second in an aqueous alkaline developer. The polymer comprises a repeating unit with a hexafluoroalcohol moiety therein. The topcoat is preferably highly soluble in an aqueous base developer but insoluble in water so that it can be used for 193 nm immersion lithography. Additionally, the topcoat material of the present invention can be adjusted to act as a TARC so that better process control of image formation can be achieved. For 193 nm immersion lithography using water as the exposure medium, the optimal refractive index for a TARC material is about 1.5 to about 1.7.

more than one co-monomers, wherein the more than one co-monomers can be of the same or different co-monomer units.

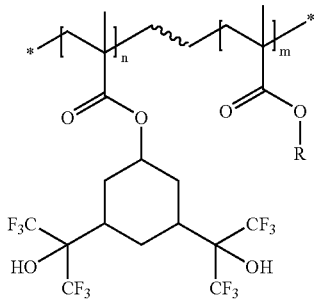

wherein R is $C_1$ to $C_{12}$ acyclic alkyl, $C_1$ to $C_{12}$ alicyclic, hydroxy substituted $C_1$ to $C_{12}$ acyclic alkyl, or hydroxy substituted $C_1$ to $C_{12}$ alicyclic; n is an integer; and m is an integer equal to or less than n.

The present invention is further directed to a coating of the inventive topcoat material on the photoresist that is thick enough to move surface bubbles, small particles and/or other contaminants out of the lithography process focal plane. This prevents defects from occurring during the photoresist expose and develop steps. By "thick" it is meant a thickness of about 10-20 times that of the photoresist. A typical thickness of the topcoat material is about 1 to about 10 microns.

The aforementioned at least one solvent is preferably immiscible with the underlying photoresist material. Suitable solvents include, but are not limited to: hydrocarbon alcohols, such as 1-butanol, 2-ethyl hexanol, methanol, ethanol, 1-propanol, ethylene glycol, 1,2-butanediol, 1,3-butanediol, 1,4-butanediol, 1,2-propanediol, 1,3-propanediol, and other hydrocarbon alcohols having 4 to 8 carbon atom The inventive polymer is preferably highly soluble in an aqueous base developer but is insoluble in water, such that the topcoat material can be rapidly stripped with a conventional photoresist developer during the resist develop step. For use in thick coatings, the inventive polymer most preferably has such a high polymer dissolution rate that the removal time for the thick film of the inventive coating is compatible with standard development. That is, the thick film can be stripped more rapidly than the standard development time.

Moreover, the inventive polymer is preferably substantially optically transparent to an appropriate exposure radiation for the underlying photoresist material, to allow patterning of the photoresist material. For use in thick coatings, the inventive polymer is most preferably substantially optically transparent at 193 nm.

It is preferable that the inventive polymer has a refractive index in the range of about 1.2 to about 1.8. For 193 nm immersion lithography using water as the exposure medium, the refractive index of the inventive polymer is most preferably in the range of about 1.5 to about 1.7.

It is also preferable that the inventive polymer has a tunable polymer molecular weight ranging from about 3K to about 500K Daltons to enable the formulation of high solid content spin castable solutions with adequate viscosity.

Since the mechanical durability of a coating improves upon increasing polymer molecular weight, it is especially preferable that the inventive polymer has a high polymer molecular weight of 20K to 500K Daltons for use in thick coatings. Co-monomers can also be added to prepare copolymer materials with improved mechanical durability and to adjust the refractive index of the coating.

Since a low glass transition temperature (Tg) allows increased diffusion of photoresist components into the topcoat layer resulting in degraded imaging performance of the photoresist, the preferable topcoat materials of the present invention are polymers having a high Tg. By "high" it is meant a Tg about equal to the photoresist processing temperature. It is more preferable that the polymer has a Tg higher than the required resist processing temperature. It is most preferable that the polymer has a Tg equal to or higher than about 130° C.

In one exemplary embodiment, the fluoroalcohol-based topcoat polymer is poly(1-methacroyl-bis-3,5-hexafluoroisopropanol-cyclo-hexanol) (hereinafter "MBHFAC"). In another embodiment, the fluoroalcohol-based topcoat polymer is poly(norbornyl hexafluoroalcohol) (hereinafter "NBHFA"). These two materials have the following structures, in which n is an integer.

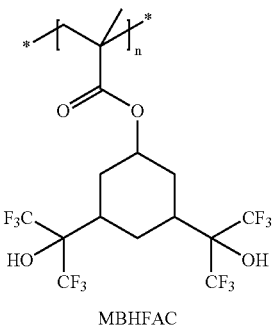

MBHFAC

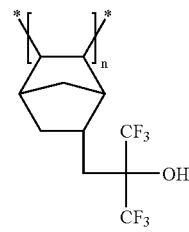

NBHFA

The optical properties of fluoroalcohols of this type are well suited for immersion applications. For example, the absorbances of these homopolymers are 0.126/micron and 0.021/micron respectively at 193 nm. Films of either material up to about 3 microns thick still have adequate transparency at 193 nm for use as immersion topcoats. The refractive index for polymers of this type is about 1.55 to about 1.6, providing a nearly ideal anti-reflection coating when paired with a 193 nm photoresist with an index of about 1.7. Furthermore, the structures of both types of polymer can be readily modified to optimize the optical properties of the topcoat material.

Since in a preferred embodiment, the inventive topcoat material is coated at a thickness of about 10-20 times that of the photoresist, a high dissolution rate of the thick topcoat (also described herein as a pellicle) is important. FIG. 1 shows the dissolution rates for both types of polymer in 0.26 N tetramethyl ammonium hydroxide (TMAH). Note that for even the slower dissolution rate of the NBHFA polymer, a 3 micron thick film would dissolve in 10 seconds under normal development conditions, and would be acceptable for use in a process with a standard 60-second development time. The methacrylate based polymer (MBHFAC) has an even faster dissolution rate. Furthermore, polymers comprising the aforementioned bis-hexafluoroalcohol monomer unit (I) have a substantially higher Tg, and thus give better imaging performance due to reduced diffusion of small-molecule components from the photoresist layer into the topcoat layer.

The molecular weight of both polymers can be tuned over a wide range. For example, a molecular weight as low as 3K Daltons and as high as 500K Daltons can be readily prepared. Blends of various molecular weights and polymer compositions can be used to modify dissolution and casting properties. At higher molecular weight, the polymer dissolution rate might be lower, but still allows the topcoat material of the present invention to be stripped without interference with the development of the underlying patterned photoresist film. In addition, both polymers are readily soluble in hydrocarbon alcohols suitable for use as casting solvents.

The structure below shows a polymer composition of a prior art topcoat material. The prior art material incorporates a monomer of isopropyl hexafluoroalcohol methacrylate (IpHFAMA), and has a composition of IpHFAMA/HADMA/HEMA in a mole ratio of 70:20:10. The Tg of the prior art polymer is about 100° C., which is less than the processing temperature of the underlying photoresist film.

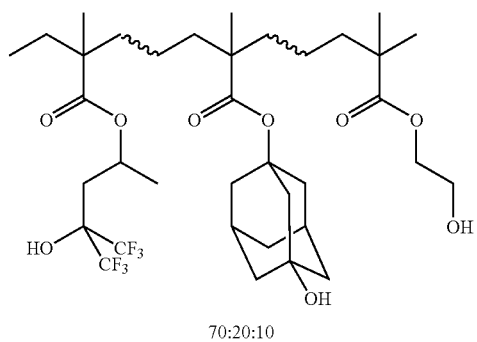

70:20:10

Prior Art Topcoat Material

The structure below shows an embodiment of the inventive polymer, which incorporates a monomer of Biscyclohexyl HFAMA and has a composition of Biscyclohexyl-HFAMA/HADMA/HEMA in a mole ratio of 70:20:10. In contrast to the prior art material, the inventive polymer which incorporates a monomer of BiscyclohexylHFAMA, has a Tg of 160° C., which is well above the required photoresist processing temperature.

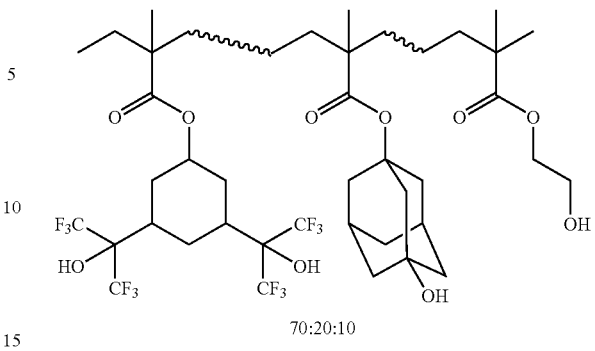

70:20:10

Topcoat Polymer Example of the Present Invention

Figure 2A:
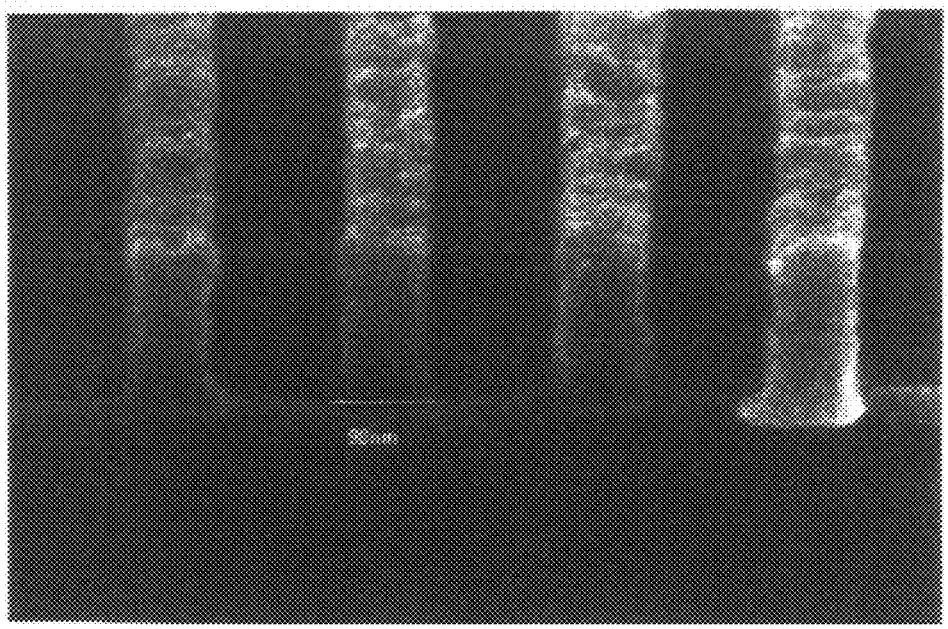
FIGS. 2A and 2B show two SEMs of the developed commercial photoresists imaged in water immersion at 193 nm and developed, utilizing 2.2 microns of the inventive topcoat applied on top of each of the photoresist layers before imaging.
Figure 2B:
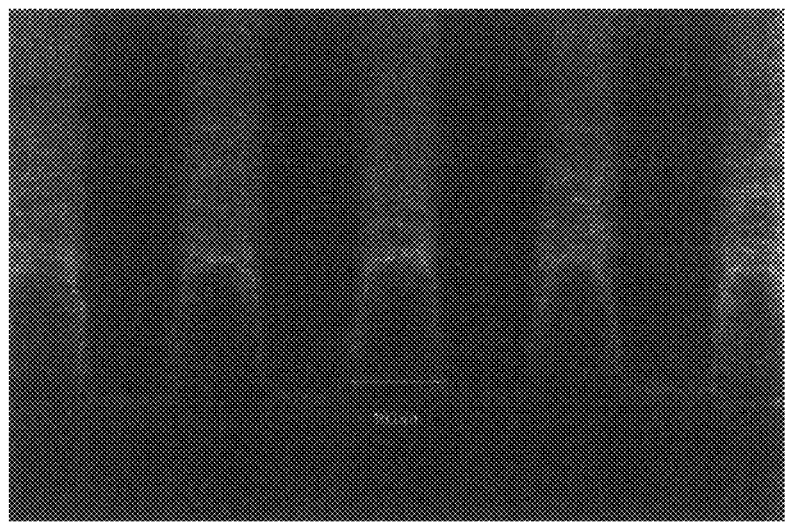

FIGS. 2A and 2B show SEM photographs of photoresist images of photoresist lines from two commercial photoresists coated at about 160 nm, in turn coated with 2.2 microns of a topcoat of the present invention imaged and developed. According to the SEMs of FIGS. 2A and 2B, the patterns utilizing the inventive topcoat material show a nearly perfect square profile.

In another aspect of the invention, the topcoat material may be used in a method of forming a patterned material layer on a substrate. The material layer may be, for example, a ceramic, dielectric, metal or semiconductor layer, such as those used in the manufacture of high performance integrated circuit devices and associated chip carrier packages.

In said method, a photoresist composition is first deposited on the substrate by known means, to form a photoresist layer on the material. The substrate with the photoresist layer may then be baked (post-apply bake, herein after "PAB") to remove any solvent from the photoresist composition and improve the coherence of the photoresist layer. Typical PAB baking temperature is about 80° to about 150° C. Typical photoresist thickness is about 100 to about 500 nm. Any suitable resist composition may be used, such as the resist composition disclosed in U.S. Pat. Nos. 6,534,239 and 6,635,401 B2, and U.S. patent application Ser. No. 10/663,553, filed Sep. 16, 2003, the disclosures of which are incorporated herein by reference.

Next, the topcoat material of the invention is applied on the photoresist layer, thereby forming a coated substrate. For 20-30 wt % polymer solutions, a spin speed of 2-5 K RPM can result in 1-3 micron thick coatings. For a 5 inch wafer, the dispense volume can be in the range of 1-3 milliliters at room temperature. The coated substrate may then be baked (softbake) to remove any solvent from the topcoat material and improve the coherence of the coating layer. Typical softbaking temperature is about 90° C. Typical softbaking time is about 90 seconds. The coated substrate is then exposed to an appropriate radiation source through a patterned mask. In one exemplary embodiment, the imaging radiation is 193 nm radiation. In another embodiment, the imaging radiation is 157 nm radiation. In another embodiment, the imaging radiation is 248 nm radiation. The coated substrate also may be exposed to such imaging radiation using immersion lithography, wherein an imaging medium is applied to the coated substrate prior to exposure. In a preferred embodiment, the imaging medium is water. The exposed substrate may then be baked (post-exposure bake) to improve the coherence of the photoresist and coating layers. Typical post-exposure baking temperature is determined by the properties of the photoresist. Those ordinarily skilled in the art can ascertain the necessary conditions without undue experiments.

The exposed substrate is then contacted with an aqueous base developer, such as 0.263 N tetramethyl ammonium hydroxide, thereby removing the topcoat material and a portion of the photoresist layer simultaneously from the coated substrate. Contact with developer forms a patterned photoresist layer on the material layer.

The pattern in the photoresist layer then may be transferred to the material layer on the underlying substrate. Typically, the transfer is achieved by reactive ion etching or some other etching technique. The method of the invention may be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes to make these (ceramic, dielectric, metal or semiconductor) features generally involve providing a material layer or section of the substrate to be patterned, applying a layer of photoresist over the material layer or section, applying a top coat layer on the layer of photoresist, patternwise exposing the top coat and photoresist layers to radiation, post-exposure baking the exposed resist, developing the pattern by contacting the exposed top coat and photoresist with a developer, etching the layer(s) underlying the photoresist layer at spaces in the pattern whereby a patterned material layer or substrate is formed, and removing any remaining photoresist from the substrate. In some instances, a hard mask may be used below the photoresist layer to facilitate transfer of the pattern to a further underlying material layer or section. It should be understood that the invention is not limited to any specific lithography technique or device structure.

The following non-limiting examples are provided to further illustrate the present invention. Because the examples are provided for illustrative purposes only, the invention embodied therein should not be limited thereto.

EXAMPLE 1

Synthesis of poly(1-methacroyl-bis-3,5-hexafluoroisopropanol-cyclo-hexanol). A 100 mL 3-neck flask was equipped with a magnetic stirrer, temperature controlled heating mantle, internal thermocouple thermometer, Friedrichs condenser with a nitrogen gas inlet tube. The flask was charged with 7.5 grams (15 mmol) of 1-methacroyl-bis-3,5-hexafluoroisoproanol-cyclohexanol, 1-dodecanethiol (0.151 gram, 0.75 mmol), and 22.5 grams of methyl ethyl ketone. The reaction mixture was nitrogen flushed and heated to 75° C. internal temperature. The polymerization initiator dimethyl-2,2'-azobisisobutyrate (Waco Chemicals V-601) (0.207 gram, 0.9 mmol) was then added to the reaction mixture, which was nitrogen flushed, then heated to reflux under a nitrogen atmosphere for 20 hours. The mixture was cooled to room temperature and added slowly to 2.0 liters of rapidly stirred hexanes. The resulting polymer solid was collected by filtration, washed with three 100 mL portions of hexane, then dried in a vacuum oven at less than 500 milliTorr for three days. A yield of 6.62 grams of dry polymer was obtained. The molecular weight of the polymer was 6.2 K Daltons (GPC in tetrahydrofuran versus polystyrene standards).

EXAMPLE 2

Reaction carried out as above except the reaction vessel was charged with 10 grams (20 mmol) of 1-methacroyl-bis-3,5-hexafluoroisopropanol-cyclohexanol, and 30 grams of methyl ethyl ketone. The reaction mixture was nitrogen flushed and heated to 75° C. internal temperature. The polymerization initiator dimethyl-2,2'-azobisisobutyrate (Waco Chemicals V-601) (0.138 gram, 0.6 mmol) was then added to the reaction mixture, which was nitrogen flushed, then heated to reflux under a nitrogen atmosphere for 20 hours. After precipitation in hexanes, filtration, and drying, 8.92 grams of polymer was obtained with a GPC Mw of about 150 K Daltons.

EXAMPLE 3

Reaction carried out as above except the reaction vessel was charged with 8 grams (16 mmol) of 1-methacroyl-bis-3,5-hexafluoroisopropanol-cyclohexanol, 0.40 gram of methyl methacrylate (0.4 mmol), and 30 grams of acetone. The reaction mixture was nitrogen flushed and heated to 56° C. internal temperature. The polymerization initiator dimethyl-2,2'-azobisisobutyrate (Waco Chemicals V-601) (0.092 gram, 0.4 mmol) was then added to the reaction mixture, which was nitrogen flushed, then heated to reflux under a nitrogen atmosphere for 20 hours. After precipitation in hexanes, filtration, and drying, 8.16 grams of polymer was obtained with a GPC Mw of greater than 250 K Daltons.

The invention claimed is:

1. A topcoat material for application atop of a photoresist material, comprising at least one solvent and a polymer having a dissolution rate of at least 3000 Å/second in an aqueous alkaline developer, wherein said polymer is a copolymer comprising a hexafluoroalcohol monomer having the following structure:

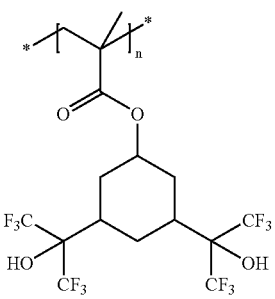

wherein n is an integer; and up to 50 mole % of one or more methacrylate or acrylate co-monomers, said topcoat material having a thickness of about 1 to about 10 microns such that bubbles or small particles present therein are not lithographically printable.

2. The topcoat material of claim 1, wherein said one or more methacrylate co-monomers are selected from the group consisting of methyl methacrylate, ethyl methacrylate, alicyclic methacrylate, acyclic alkyl substituted methacrylates, methacrylic acid, hydroxyethyl methacrylate, hydroxypropyl methacrylate, hydroxy substituted alicyclic methacrylate, and acyclic hydroxyalkyl substituted methacrylates, wherein the alkyl and the alicyclic independently have 1 to 12 carbon atoms.

3. The topcoat material of claim 1, wherein said one or more acrylate co-monomers are selected from the group consisting of methyl acrylate, ethyl acrylate, alicyclic acrylate, acyclic alkyl substituted acrylates, acrylic acid, hydroxyethyl acrylate, hydroxypropyl acrylate, hydroxy substituted alicyclic acrylate, and acyclic hydroxyalkyl substituted acrylates, wherein the alkyl and the alicyclic independently have 1 to 12 carbon atoms.

4. The topcoat material of claim 1, wherein said at least one solvent is immiscible with the photoresist material.

5. The topcoat material of claim 1, wherein said at least one solvent is a hydrocarbon alcohol.

6. The topcoat material of claim 1, wherein said at least one solvent is selected from the group consisting of 1-butanol, methanol, ethanol, 1-propanol, ethylene glycol, 1,2-butanediol, 1,3-butanediol, 1,4-butanediol, 1,2-propanediol, 1,3-propanediol, and other hydrocarbon alcohols having 4 to 8 carbon atoms.

7. The topcoat material of claim 1, wherein the polymer is insoluble in water.

8. The topcoat material of claim 1, wherein the polymer is substantially optically transparent to an appropriate exposure radiation for the underlying photoresist material.

9. The topcoat material of claim 1, wherein the polymer has a refractive index in the range of about 1.2 to about 1.8.

10. The topcoat material of claim 1, wherein the polymer has a refractive index in the range of about 1.5 to about 1.7.

11. The topcoat material of claim 1, wherein the polymer has a tunable molecular weight ranging from about 3K Daltons to about 500K Daltons.

12. The topcoat material of claim 1, wherein the polymer has a Tg equal to or above the photoresist processing temperature.

13. The topcoat material of claim 1, wherein the polymer has a Tg of about 130° C. or above.

14. A method of forming a patterned material layer on a substrate, the method comprising:

providing a substrate having a material layer on a surface thereof;

depositing a photoresist composition on the substrate to form a photoresist layer on the material;

applying a topcoat material on the photoresist layer, such that its thickness is about 1 to about 10 microns so that bubbles or small particles present thereon are not lithographically printable, thereby forming a coated substrate, the topcoat material comprising a polymer containing a hexafluoroalcohol monomer unit comprising one of the following two structures:

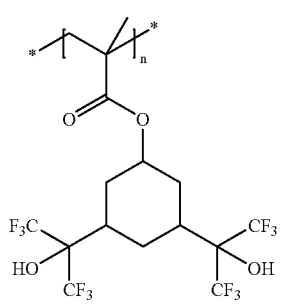

(I)

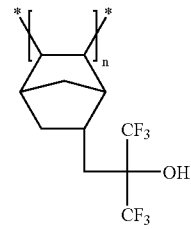

(II)

wherein n is an integer; and up to 50 % of one or more methacrylate or acrylate comonomers;

pattern-wise exposing the coated substrate to an imaging radiation;

contacting the coated substrate with an aqueous alkaline developer, wherein the topcoat material and a portion of the photoresist layer are simultaneously removed from the coated substrate, thereby forming a patterned photoresist layer on the material layer; and transferring the pattern in the photoresist layer to the material layer.

15. The method of claim 14, wherein the topcoat material and portions of the photoresist layer are removed by contacting the resist layer with an aqueous alkaline developer.

16. The method of claim 14, wherein the aqueous alkaline developer is 0.263 N tetramethyl ammonium hydroxide.

17. The method of claim 14, wherein the material layer is selected from the group consisting of a ceramic, a dielectric, a metal and a semiconductor layer.

18. The method of claim 14, wherein the imaging radiation is 193 nm radiation.

19. The method of claim 14, wherein the imaging radiation is 157 nm radiation.

20. The method of claim 14, wherein the imaging radiation is 248 nm radiation.

21. The method of claim 14, further comprising, prior to pattern-wise exposing the coated substrate to imaging radiation, the step of applying an imaging medium to the coated substrate.

22. The method of claim 21, wherein the imaging medium is water.

23. The method of claim 14, wherein the pattern in the photoresist layer is transferred to the material layer by removing portions of the material layer not covered by the patterned photoresist layer.

24. The method of claim 23, wherein portions of the material layer are removed by etching the material layer in areas not covered by the patterned photoresist layer.

25. The method of claim 23, wherein portions of the material layer are removed by using reactive ion etching.

* * * * *